US009899755B2

(12) United States Patent
Yamada et al.

(10) Patent No.: US 9,899,755 B2
(45) Date of Patent: Feb. 20, 2018

(54) CONNECTOR AND CONNECTION STRUCTURE

(71) Applicant: Tyco Electronics Japan G.K., Kanagawa (JP)

(72) Inventors: Shinji Yamada, Kanagawa (JP); Yusuke Okada, Kanagawa (JP)

(73) Assignee: Tyco Electronics Japan G.K., Kanagawa-ken (JP)

( * ) Notice: Subject to any disclaimer, the term of this patent is extended or adjusted under 35 U.S.C. 154(b) by 0 days.

(21) Appl. No.: 15/411,488

(22) Filed: Jan. 20, 2017

(65) Prior Publication Data

US 2017/0214161 A1 Jul. 27, 2017

(30) Foreign Application Priority Data

Jan. 21, 2016 (JP) ................................ 2016-009487

(51) Int. Cl.

| | |
|---|---|
| ***H01R 12/00*** | (2006.01) |
| ***H05K 1/00*** | (2006.01) |
| ***H01R 12/71*** | (2011.01) |
| ***H01R 12/70*** | (2011.01) |
| ***H01R 13/05*** | (2006.01) |

(52) U.S. Cl.

CPC ....... *H01R 12/716* (2013.01); *H01R 12/7005* (2013.01); *H01R 13/055* (2013.01)

(58) Field of Classification Search

CPC .. H01R 12/91; H01R 13/6315; H01R 12/526; H01R 43/0256; H01R 12/707; H01R 13/28

USPC .................. 439/83, 247, 248, 563, 569–570

See application file for complete search history.

(56) References Cited

U.S. PATENT DOCUMENTS 5,112,235 A * 5/1992 Enomoto ............... H01R 13/11 439/246
5,232,379 A * 8/1993 Lai ........................ H01R 12/57 248/222.12

(Continued)

FOREIGN PATENT DOCUMENTS

| | | | |
|---|---|---|---|
| JP | 6231840 | A | 8/1994 |
| JP | 2010118314 | A | 5/2010 |
| KR | 1020110095255 | A | 8/2011 |

OTHER PUBLICATIONS

Abstract of JP2010118314, dated May 27, 2010, 2 pages.
Korean Office Action, dated Sep. 27, 2017, 4 pages.

*Primary Examiner* — Abdullah Riyami
*Assistant Examiner* — Thang Nguyen
(74) *Attorney, Agent, or Firm* — Barley Snyder

(57) ABSTRACT

A connector mounted to a circuit board and mating with a mating connector in a mating direction extending along the circuit board is disclosed. The connector comprises a contact having a resilient contact portion, a housing retaining the contact and having a pair of restricting projections, and a retainer having a resilient retainer portion. The retainer is disposed between the pair of restricting projections and retains the housing on the circuit board. The pair of restricting projections restricts movement between the housing and the circuit board in the mating direction and the resilient contact portion and the resilient retainer portion permit movement between the housing and the circuit board in a plurality of directions perpendicular to the mating direction.

16 Claims, 13 Drawing Sheets

(56) References Cited

U.S. PATENT DOCUMENTS

| | | | | | |
|---|---|---|---|---|---|
| 5,704,808 | A * | 1/1998 | Chishima | H01R 12/707 | 439/571 |
| 6,083,045 | A * | 7/2000 | Chiu | H01R 12/707 | 439/570 |
| 6,280,247 | B1 * | 8/2001 | Wu | H01R 12/7052 | 439/570 |
| 6,471,544 | B1 * | 10/2002 | Huang | H01R 12/7029 | 439/567 |
| 6,579,122 | B1 * | 6/2003 | Chen | H01R 12/707 | 439/570 |
| 8,801,449 | B2 * | 8/2014 | Huang | H01R 13/648 | 439/108 |
| 8,814,576 | B2 * | 8/2014 | Yoshida | H01R 12/57 | 439/76.1 |

* cited by examiner

CONNECTOR AND CONNECTION STRUCTURE

CROSS-REFERENCE TO RELATED APPLICATION

This application claims the benefit of the filing date under 35 U.S.C. § 119(a)-(d) of Japanese Patent Application No. 2016-009487, filed on Jan. 21, 2016.

FIELD OF THE INVENTION

The present invention relates to a connector, and more particularly, to a connector movable with respect to a circuit board.

BACKGROUND

A connector mounted to a circuit board and mating with a mating connector to form an electrical connection is known in the art. For example, a connector mounted to an encoder circuit board of a servo motor relays power for activating the encoder circuit and an output signal indicting a rotation state of the motor.

Japanese Patent Application Laid Open No. 2010-118314 shows an electric connector mounted to a circuit board and having a mechanism enabling motion of the connector with respect to the circuit board. The electric connector can be moved in a horizontal direction and a depth direction with respect to the circuit board.

When a mating connector, however, attempts to mate in the depth direction with the connector of JP 2010-118314A, the connector moves in the depth direction. Since the connector is moved in a direction away from the mating connector, there is a possibility that a semi-mated state occurs between the both connectors. Further, the connector described in JP 2010-118314A cannot move in a direction approximately perpendicular to the mating depth direction. As a result, when a mating connector retained, for example, by a machine is mated with the connector, the connector cannot adjust position perpendicular to the mating direction, and there is a possibility that even when a retaining position of the mating connector only slightly deviates from a normal position, mating cannot be performed.

SUMMARY

An object of the invention, among others, is to provide a connector which has a high tolerance to positional deviation of a mating connector and can securely mate with the mating connector. The connector comprises a contact having a resilient contact portion, a housing retaining the contact and having a pair of restricting projections, and a retainer having a resilient retainer portion. The retainer is disposed between the pair of restricting projections and retains the housing on the circuit board. The pair of restricting projections restricts movement between the housing and the circuit board in the mating direction and the resilient contact portion and the resilient retainer portion permit movement between the housing and the circuit board in a plurality of directions perpendicular to the mating direction.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
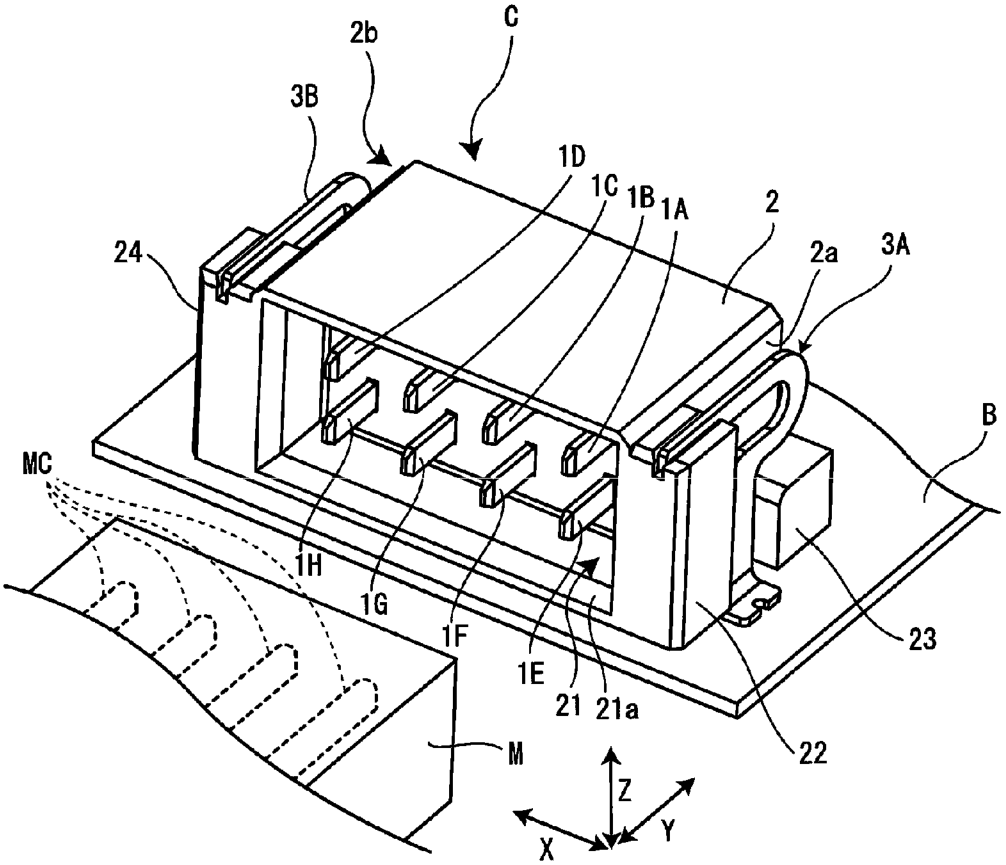
FIG. 1 is a front perspective view of a connector according to the present invention.
Figure 2:
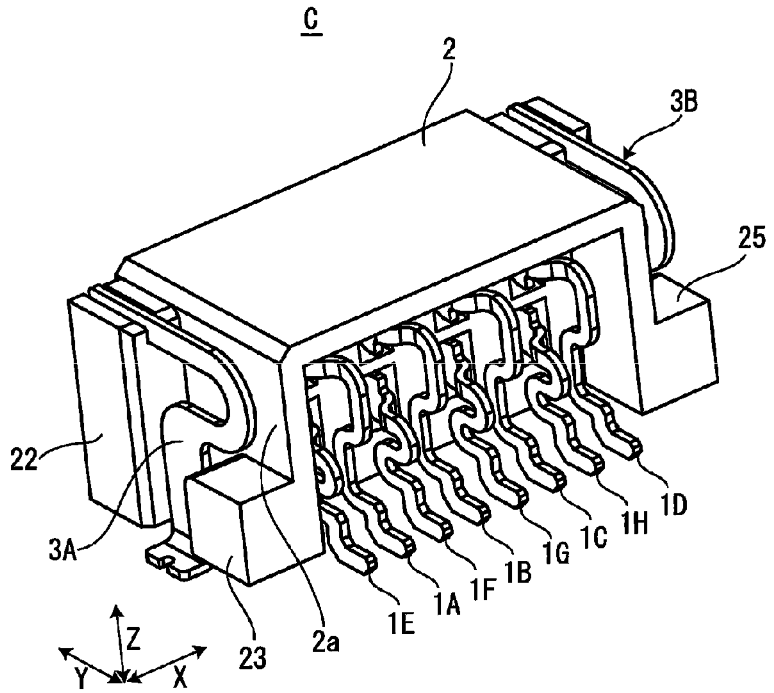
FIG. 2 is a back perspective view of the connector of FIG. 1.
Figure 3:
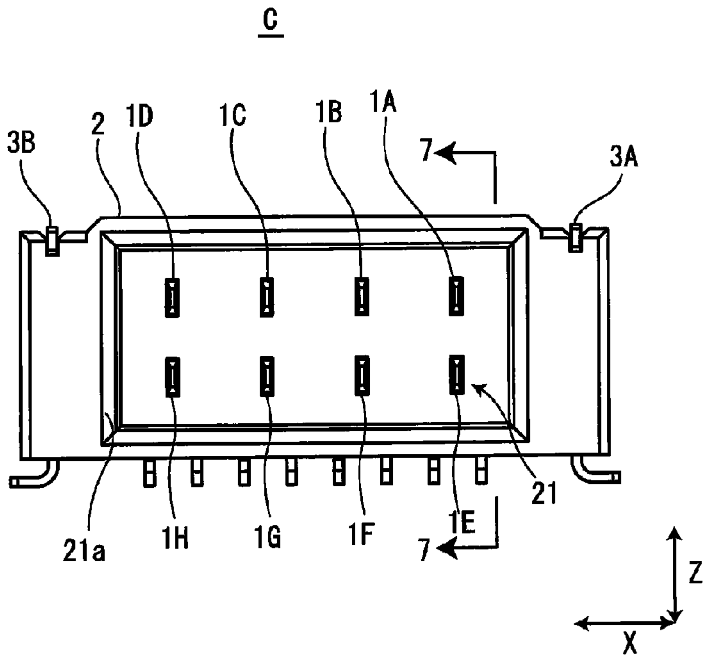
FIG. 3 is a front view of the connector of FIG. 1.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete, and will fully convey the concept of the invention to those skilled in the art.

A connector C according to the invention is shown in FIG. 1. The connector C shown in FIG. 1 is a surface-mounted type of connector, and it is mounted on a surface of a circuit board B by soldering. The connector C electrically connects the circuit board B and a cable connected to a mating connector M by mating with the mating connector M.

The connector C is a right-angle type connector, and it mates with the mating connector M in a direction extending along the circuit board B. In the connector C, the direction of mating with the mating connector M is referred to as a mating direction (or a front and back direction) Y. In the mating direction Y, a mating side of the connector C mating with the mating connector M is referred to as a front side, while an opposite side thereto is referred to as a back side. Further, a direction perpendicular to the mating direction Y and extending along the circuit board B is referred to as a left and right direction X. Further, a direction perpendicular to both the mating direction Y and the left and right direction, namely, a direction approximately perpendicular to the circuit board B is referred to as a perpendicular direction (a vertical direction) Z.

The connector C shown in FIGS. 1-5 has eight contacts 1 (1A to 1H), a housing 2 retaining these contacts 1, and two retainers 3A and 3B. The housing 2 has a rectangular mating recess 21 opened to the front side. A mating contact MC achieves mating such that it enters in the mating recess 21 of the housing 2. The contacts 1A to 1H contact with the mating contacts MC in a state where the connector C and the mating connector M have mated with each other.

The contacts 1A to 1H are arranged on a bottom of the mating recess 21 of the housing 2 in a two-level fashion along the perpendicular direction (the vertical direction) Z. The contacts 1A to 1H project within the mating recess 21 toward the mating direction Y, respectively. Four contacts 1A to 1D of the contacts 1A to 1H are arranged at an upper level relatively apart from the circuit board B and have configurations similar to one another. Further, four contacts 1E to 1H are arranged at a lower level relatively close to the circuit board B and have configurations similar to one another.

Figures 6A, 6B:
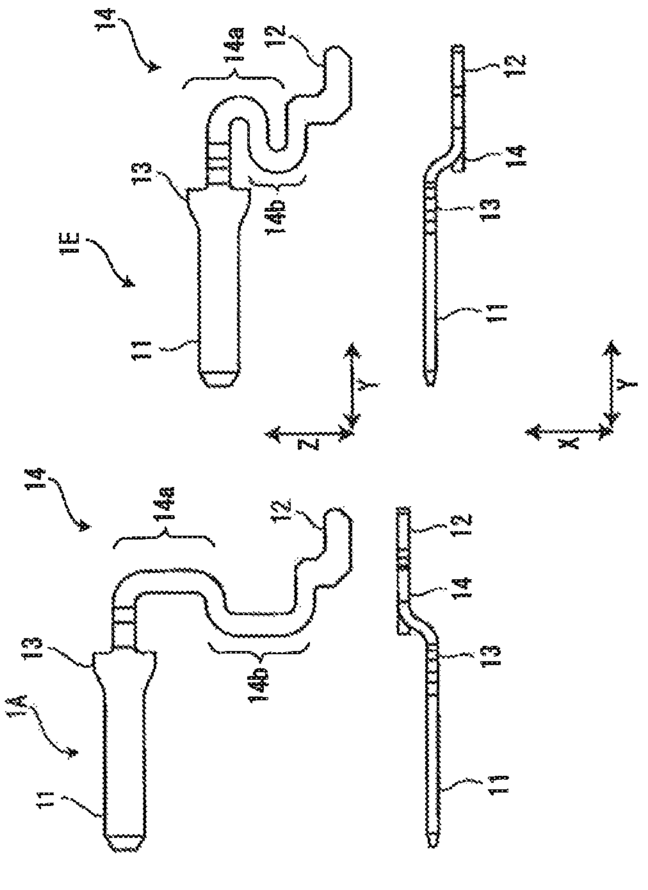
FIG. 6A is a side view of a contact of the connector of FIG. 1.
FIG. 6B is a plan view of the contact of FIG. 6A.

One representative upper level contact 1A and one representative lower level contact 1E are shown in FIG. 6. Each contact 1A, 1E has a contact end 11, a board connection end 12, a press-fitting contact portion 13, and a resilient contact portion 14. The contacts 1A and 1E are formed by stamping and bending of a conductive metal plate having elasticity. Therefore, the contact end 11, the board connection end 12, the press-fitting contact portion 13, and the resilient contact portion 14 are formed integrally.

Figure 7:
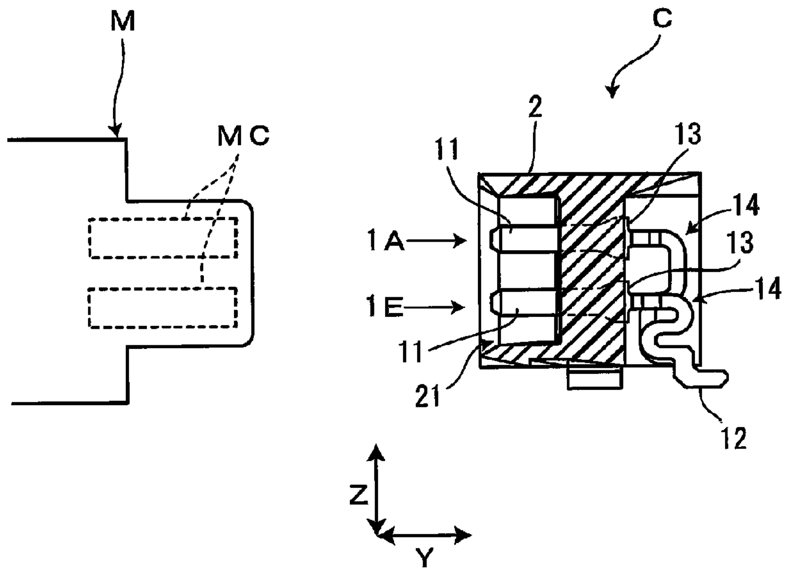
FIG. 7 is a sectional view of the connector of FIG. 1 taken along line 7-7 of FIG. 3.

The contact end 11 makes contact with the mating contact MC. The contact end 11 extends in the mating direction Y. As shown in FIG. 7, the contact end 11 projects from a bottom of the mating recess 21 in the mating direction Y. The board connection end 12 is a portion connected to the circuit board B by soldering.

The press-fitting contact portion 13 is disposed between the contact end 11 and the board connection end 12. The press-fitting contact portion 13 is disposed on a back side of the contact end 11 and is wider than the contact end 11. The press-fitting contact portion 13 is press-fitted into the housing 2 to be retained and fixed to the housing 2.

The resilient contact portion 14, as shown in FIG. 6, is disposed between the press-fitting contact portion 13 and the board connection end 12. The contact 1A at the upper level and the contact 1E at the lower level have a different length in the perpendicular direction Z of the resilient contact portion 14.

The board connection end 12 of the contact 1A at the upper level and the board connection end 12 of the contact 1E at the lower level are connected to the common circuit board B, as shown in FIG. 1, and the respective contact end portions 11 are arranged at different levels from each other in the perpendicular direction Z. The resilient contact portion 14 elastically deforms to allow a relative movement between the housing 2 and the board connection end 12.

The resilient contact portion 14 has a first curved portion 14*a* and a second curved portion 14*b* as shown in FIG. 6. The first curved portion 14*a* extends in a direction away from the mating connector M in the mating direction Y, namely, toward the back side, and next turns to extends in a direction towards the mating connector M, namely, toward the front side. The second curved portion 14*b* is reversed from a distal end of the first curved portion 14*a*. In the shown embodiment, the first curved portion 14*a* has a U shape connected to the press-fitting contact portion 13 and opened toward the front side, and the second curved portion 14*b* has a U shape connected to the first curved portion 14*a* and opened toward the back side. The resilient contact portion 14 thus has an S shape obtained by combining the above two U shapes. Since the resilient contact portion 14 has the first curved portion 14*a* and the second curved portion 14*b*, a structure allowing a relative movement of the housing 2 in the perpendicular direction Z is made small in size. Further, since the resilient contact portion 14 has an S shape as a whole, even if the contact end 11 moves in the perpendicular direction Z due to an elastic deformation, an attitude of the contact end 11 facing in the mating direction Y is maintained.

Figure 8:
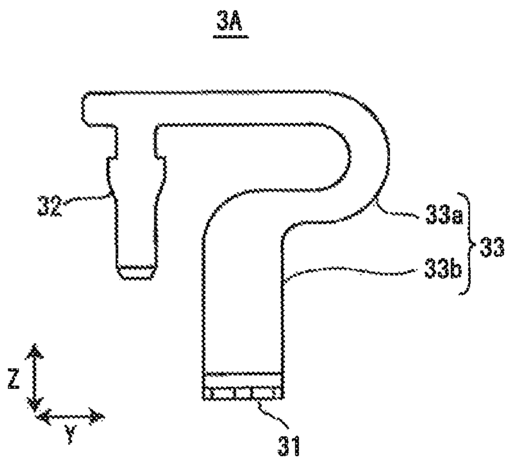
FIG. 8A is a side view of a retainer of the connector of FIG. 1.
FIG. 8B is a front view of the retainer of FIG. 8A.
Figure 8:
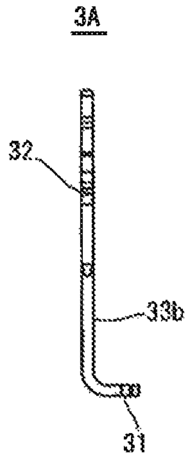

The retainers 3A, 3B are identical in the embodiment shown in FIG. 1. As shown in FIG. 8, the retainer 3A has a board fixing portion 31, a press-fitting retainer portion 32, and a resilient retainer portion 33. The retainer 3A is formed by performing stamping to a conductive metal plate having an elasticity and next performing bending to a portion of the board fixing portion 31. Therefore, the board fixing portion 31, the press-fitting retainer portion 32, and the resilient retainer portion 33 are formed integrally.

The board fixing portion 31 is connected to the circuit board B, as shown in FIG. 1, by soldering. The press-fitting retainer portion 32 is press-fitted into the housing 2 to be fixed to the housing 2. The resilient retainer portion 33 is disposed between the board fixing portion 31 and the press-fitting retainer portion 32. The resilient retainer portion 33 elastically deforms to allow a relative movement between the housing 2 fixing the press-fitting retainer portion 32 and the board fixing portion 31.

The resilient retainer portion 33 has a curved portion 33*a* and a straight portion 33*b*. The curved portion 33*a* extends in a direction away from the mating connector M in the mating direction Y, namely, toward the rear side and then turns to extend in a direction toward the mating connector M, namely, toward the front side. The curved portion 33*a* has a U shape opened toward the front side. The straight portion 33*b* extends straight from the curved portion 33*a* to the board fixing portion 31 in the perpendicular direction Z.

Figure 4:
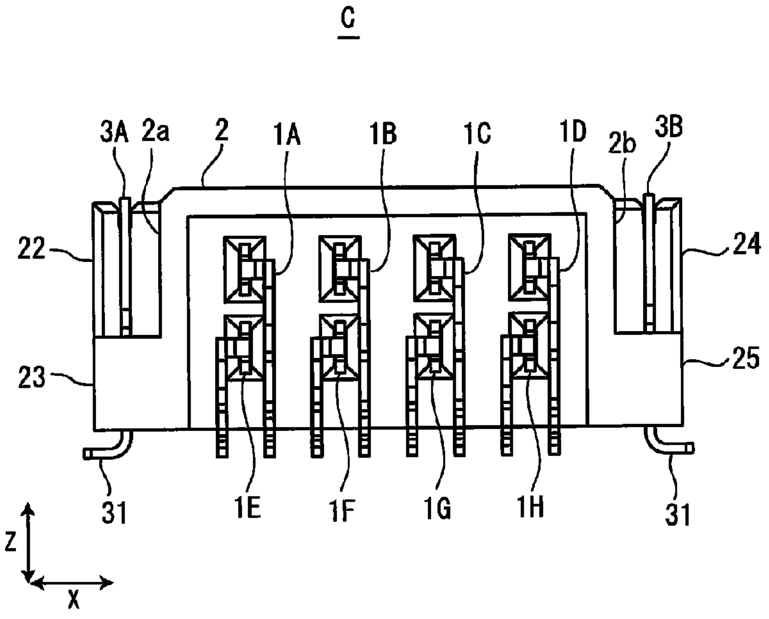
FIG. 4 is a back view of the connector of FIG. 1.
Figure 5:
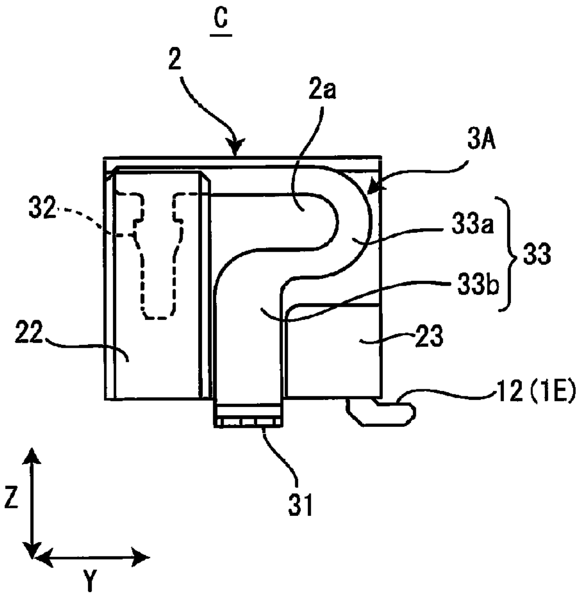
FIG. 5 is a side view of the connector of FIG. 1.

The housing 2 shown in FIGS. 1-4 is a molded product made of insulating resin material. The housing 2 has an approximately parallelepiped outer shape, and the mating recess 21 is opened to a front side face of the housing 2 facing the mating connector M. A slope 21*a* spreading toward the outside is formed at a peripheral edge of the opening portion of the mating recess 21. Restricting projections 22-25 projecting in the left and right direction X are provided on respective side faces 2*a*, 2*b* of the housing 2 in the left and right direction in a paired manner. The restricting projections 22, 24 of the restricting projections of the respective pairs provided on the front side also serve as retaining portions of the retainers 3A, 3B, and the press-fitting retainer portions 32 of the retaining portions 3A, 3B are press-fitted therein. As shown in FIG. 5, the retainers 3A, 3B are retained by the housing 2 such that the board fixing portion 31 projects from the housing 2 downward, namely, toward the circuit board B. Further, as explained previously, the retainers 3A, 3B are formed by performing stamping to a metal plate, and the fitting elastically deformable portions 33 of the retainers 3A, 3B are arranged such that their plate faces face in the left and right direction X. Further, as shown in FIG. 4, clearances are provided between the retainers 3A, 3B and the side faces 2*a*, 2*b* of the housing 2, respectively.

The pair of restricting projections 22, 23 shown in FIG. 5 are provided at positions sandwiching a portion of the retainer 3A between the press-fitting retainer portion 32 and the board fixing portion 31 from both side in the mating direction Y. In more detail, the pair of restricting projections 22, 23 are provided at positions of sandwiching the straight portion 33*b* of the resilient retainer portion 33 of the retainer 3A extending in the perpendicular direction Z from both sides in the mating direction Y. The above-described positional relationship also applies to an arrangement relationship between the pair of restricting projections 24, 25 provided on the side face 2*b* opposed to the side face 2*a* shown in FIG. 5, and the retainer 3B.

The housing 2 of the connector C of the present embodiment is supported by the circuit board B via the retainers 3A, 3B having the resilient retainer portions 33. Therefore, according to elastic deformations of the resilient retainer 33, the housing 2 can move relative to the circuit board B in the left and right direction X and the perpendicular direction Z. The resilient retainer portions 33 warp so that the housing 2 can move in the left and right direction. Further, the curved portions 33*a* of the resilient retainer portions 33 deform such that the curves are opened or closed, so that the housing 2 can move in the perpendicular direction Z. Therefore, even if the position of the mating connector M mating with the connector C deviates from a target position in the left and right direction X and the perpendicular direction Z which are perpendicular to the mating direction Y, the housing 2 of the connector C can follow the deviation. Further, even if the position of the mating connector M deviates in the left and right direction and the perpendicular direction prior to contact of the mating connector M with the connector C, the mating connector M is guided by the slope 21*a* provided on the opening peripheral edge of the mating recess 21, so that positioning is performed. Further, the first curved portions 14*a* of the resilient contact portions 14 have the same shape as that of the curved portion 33*a* of the resilient retainer portion 33. Therefore, the contact ends 11 supported by the housing 2 via the press-fitting contact portion 13 can also follow movement of the housing 2.

Deformations of the retainers 3A, 3B in the mating direction Y are suppressed by the restricting projections 22-25. That is, the relative movement of the retainers 3A, 3B between the housing 2 fixing the housing press-fitting retainer portions 32 and the board fixing portion 31 in the mating direction Y is restricted. Therefore, when the mating connector MC mates with the connector C, movement of the connector C in the mating direction Y is restricted. Therefore, even when the mating connector MC is caused to mate with the connector C, for example, by using a manufacturing machine, secure mating is achieved without resulting in a semi-mated state.

An application example of the above-described connector C will now be described in greater detail.

Figure 9:
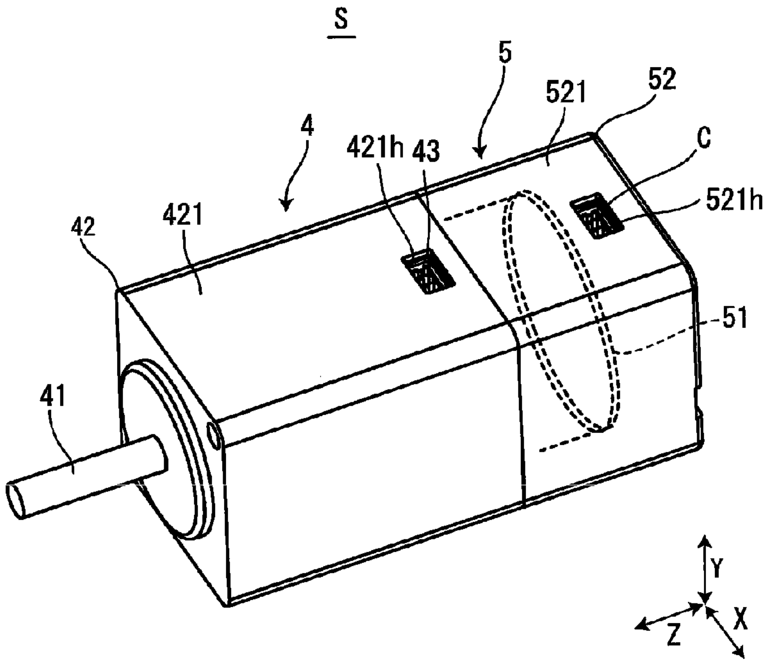
FIG. 9 is a perspective view of a servo motor.

A servo motor S is shown in FIG. 9 and has a motor 4 receiving power to be driven and an encoder 5 detecting a rotation state of the motor 4. The motor 4 is provided with a rotation shaft 41, a motor cover 42, and a motor connector 43. The motor cover 42 has a side face portion 421 surrounding the rotation shaft 421. The motor connector 43 is a connector for supply power to the motor 4. The motor connector 43 is arranged inside the motor cover 42, but it is exposed to the outside via a hole 421*h* provided in the side face portion 421.

The motor 4 and the encoder 5 are arranged in an extension direction of the rotation shaft 41 so as to align with each other. The encoder 5 is provided with a circuit board 51, an encoder cover 52, and an encoder connector C. The circuit board 51 converts a rotation state of the rotation shaft 41 to an electric signal. The circuit board 51 is arranged perpendicularly to the extension direction of the rotation shaft 41. The encoder connector C is attached to the circuit board 51. The encoder cover 52 covers the circuit board 51. The encoder cover 52 has a side face portion 521 spreading continuously to the side face portion 421 of the motor cover 42. The encoder connector C is arranged inside the encoder cover 52, but it is exposed to the outside via a hole 521*h* provided in the side face portion 521. The motor connector 43 and the encoder connector C are arranged in the extension direction of the rotation shaft 41 so as align with each other.

The encoder connector C is provided with the same configuration as that of the connector C which has been explained with reference to FIG. 1-8. Therefore, the encoder connector C and the connector C are represented by the same reference sign. Further, the extension direction of the rotation shaft 41, namely, the perpendicular direction to the circuit board 1, is referred to as the perpendicular direction Z so as to conform with the direction of the connector C shown in FIGS. 1-8. In addition, the direction where the encoder connector C faces the hole 521*h* of the side face portion 521 is referred to as the mating direction Y, and the perpendicular direction perpendicular to both of the perpendicular direction Z and the mating direction Y is referred to as the left and right direction X.

Figure 10:
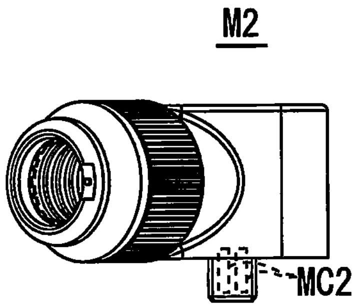
FIG. 10 is a side view of a mating connector.
Figure 11:
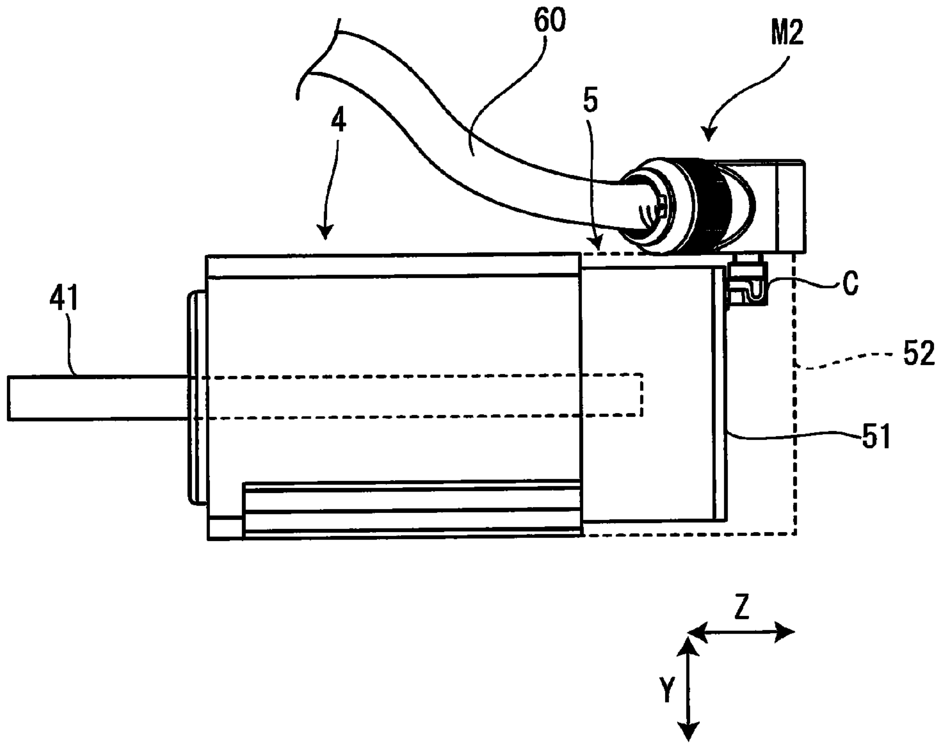
FIG. 11 is a side view of a connection between the mating connector of FIG. 10 and the connector of FIG. 1.
Figure 12:
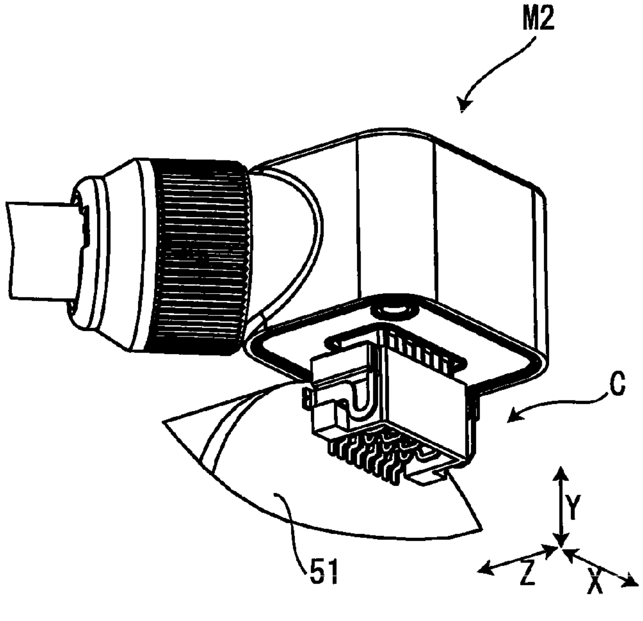
FIG. 12 is a perspective view of the connection of FIG. 11.

The mating connector M2, as shown in FIGS. 10-12, is one for relaying an electric signal from the encoder 5 to a control device of the motor 4, and terminates a cable 60 extending from the control device. In a connection structure of the mating connector MC2 and the connector C, the mating connector M2 has eight mating contact MC2. The mating connector M2 mates with the encoder connector C through the hole 521*h* of the encoder cover, so that the contacts MC2 make contact with the contacts 1A to 1H of the encoder connector C, respectively. An electric signal outputted from the circuit board 51 is relayed at the encoder connector C to be transmitted to the control device. In the servo motor S of the present embodiment, the encoder connector C is attached in the vicinity of an edge of the circuit board 51. Further, the encoder connector C is attached such that the mating recess 21 (see FIG. 1) has the same direction as that of the edge of the circuit board 51. That is, the mating recess 21 is opened toward the mating direction Y extending along the circuit board 51. Further, the hole 521*h* of the encoder cover is formed at a position facing the mating recess 21 of the encoder connector C.

Figure 13:
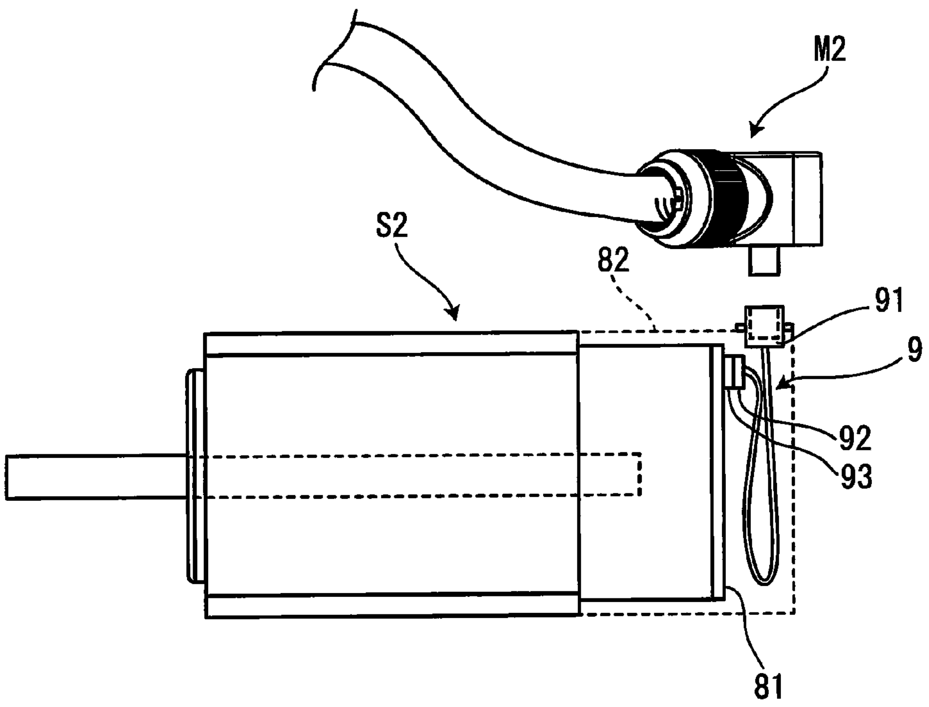
FIG. 13 is a side view of a servo motor according to another embodiment.

In another embodiment shown in FIG. 13, a relay cable 9 is used to relay an electric signal outputted from a circuit board to the mating connector M2. One end of the relay cable 9 is provided with a first connector 91 connected to the mating connector M2, and the other end thereof is provided with a second connector 92 connected to a circuit board 81. An assembling step of the servo motor of the reference example is performed in the following manner: The first connector 91 is first attached to an encoder cover 82 which has been separated from the servo motor. Next, the second connector 92 of the relay cable 9 is pulled out from the inside of the encoder cover 82 and the second connector 92 is connected to the connector 93 mounted on the circuit board 81. Next, the encoder cover 82 is attached so as to cover the circuit board. The above-described assembling step is complicated, and it is difficult to mechanize working inside the encoder cover 82.

In the servo motor S having the encoder connector C of FIGS. 9-11, a relay between the circuit board 51 and the mating connector M2 can be performed by using only one encoder connector C. Further, since no cable exists in the encoder cover 52, the working is completed in the assembling step by only connecting the encoder connector C to the circuit board 51 like other parts through soldering in advance and attaching the encoder cover 52 so as to cover the encoder cover 51. Therefore, mechanization of assembling becomes easy. In addition, the relay cable and the connectors at both ends thereof can be reduced.

Further, in the servo motor S of the present embodiment, the encoder connector C can move in the perpendicular direction Z and the left and right direction X according to elastic deformations of the fitting elastically deformable portions 33 of the retainers 3A, 3B. In the servo motor S, the position of the mating recess 21 of the encoder connector C and the position of the hole 521*h* of the encoder cover 52 may deviate from target positions due to a deviation of the mounting position of the encoder connector C on the circuit board 51 or a deviation of the encoder cover 52. In the servo motor S of the present embodiment, since the encoder connector C can move relative to the encoder cover 52, the mating connector M2 is caused to mate through the hole 521*h* without being blocked by the encoder cover 52. Further, movement of the encoder connector C in the mating direction Y is restricted. That is, when the mating connector M2 mates with the encoder connector C, escape of the encoder connector C in the mating direction Y is restricted. Therefore, when the mating connector M2 is caused to mate with the connector C, mating can be securely performed without occurrence of a semi-mated state.

In the above-described embodiment, the encoder connector C which has been arranged in the encoder of the servo motor is shown as the example of the connector in the present invention. However, the connector of the present invention is not limited to this example, but may, for example, be arranged in another type of electronic device.

Further, in the above-described embodiment, the connector C is of the surface-mounted type mounted on the surface of the circuit board B. However, the connector of the present invention is not limited to this example, but it may be one of such a type that contacts and a retainer are inserted into through-holes to be fixed, for example.

Further, in the above-described embodiment, the press-fitting retainer portion 32 is shown as the example of the housing fixing portion of the retainer in the present invention. However, the present invention is not limited to this example, but fixing of the retainer may be performed by adhesion, for example.

Further, in the above-described embodiment, eight contacts 1A to 1H are shown as the example of the contacts in the present invention. However, the present invention is not limited to this example, but the number of contacts may be seven or less or nine or more, for example.

Further, in the above-described embodiment, two retainers 3A, 3B are shown as the example of the retainers in the present invention. However, the present invention is not limited to this example, but the number of retainers may be three or more, for example.

Further, in the above-described embodiment, the mating recess 21 is shown as the example of the mating portion in the present invention. However, the present invention is not limited to this example, but the mating portion may be a mating projection portion, for example.

Advantageously, in the connector C of the present invention, since both the contact 1 and the retainer 3 have resilient portions, the relative movement between the housing 2 and the circuit board B is allowed. However, since the retainer 3 is sandwiched by the restricting portions 22-25, relative movement between the housing 2 and the circuit board B in the mating direction is restricted. Therefore, the connector C of the present invention has a high tolerance to a positional deviation of the mating connector MC in a direction perpendicular to the mating direction, and can securely mate with the mating connector MC without resulting in a semi-mated state.

What is claimed is:

1. A connector mounted to a circuit board and mating with a mating connector in a mating direction extending along the circuit board, comprising:

- a contact having a resilient contact portion;
- a housing retaining the contact and having a pair of restricting projections; and
- a retainer disposed between the pair of restricting projections, retaining the housing on the circuit board, and having a resilient retainer portion, a board fixing portion fixed to the circuit board, and a press-fitting retainer portion press-fitted into the housing, the pair of restricting projections restricting movement between the housing and the circuit board in the mating direction and the resilient contact portion and the resilient retainer portion permitting movement between the housing and the circuit board in a plurality of directions perpendicular to the mating direction.

2. The connector of claim 1, wherein a contact end of the contact contacts a mating contact of the mating connector.

3. The connector of claim 2, wherein the contact has a board connection end opposite the contact end, the board connection end connected to the circuit board.

4. The connector of claim 3, wherein the contact has a press-fitting contact portion disposed between the contact end and the board connection end.

5. The connector of claim 4, wherein the press-fitting contact portion is press-fitted into the housing.

6. The connector of claim 5, wherein the resilient contact portion is disposed between the press-fitting contact portion and the board connection end.

7. The connector of claim 6, wherein the resilient contact portion permits movement between the board connection end and the housing retaining the press-fitting contact portion.

8. The connector of claim 1, wherein the resilient retainer portion is disposed between the board fixing portion and the press-fitting retainer portion.

9. The connector of claim 8, wherein the resilient retainer portion permits movement between the board fixing portion and the housing retaining the press-fitting retainer portion.

10. The connector of claim 1, wherein the pair of restricting projections abut the retainer between the press-fitting retainer portion and the board fixing portion at each of a pair of opposite sides of the retainer in the mating direction.

11. The connector of claim 1, wherein the resilient contact portion and the resilient retainer portion each has a curved shape extending in the mating direction away from the mating connector and turning to extend in the mating direction toward the mating connector.

12. The connector of claim 2, wherein the housing has a mating recess open in a direction opposite the mating direction.

13. The connector of claim 12, wherein the contact end projects within the mating recess in the direction opposite the mating direction.

14. The connector of claim 13, wherein the housing has a slope formed at a peripheral edge of the mating recess.

15. A connection structure, comprising:

- a motor having a rotation shaft;
- a circuit board disposed within the motor;
- a mating connector mounted to the circuit board and terminating a cable; and
- a connector mating with the mating connector in a mating direction extending along the circuit board, the connector comprising:
  - a contact having a resilient contact portion,
  - a housing retaining the contact and having a pair of restricting projections, and
  - a retainer disposed between the pair of restricting projections, retaining the housing on the circuit board, and having a resilient retainer portion, the pair of restricting projections restricting movement between the housing and the circuit board in the mating direction and the resilient contact portion and the resilient retainer portion permitting movement between the housing and the circuit board in a plurality of directions perpendicular to the mating direction.

16. The connection structure of claim 15, wherein the circuit board extends in a direction perpendicular to the rotation shaft.

* * * * *